United States Patent [19]
Banerjee et al.

[11] Patent Number: 5,787,575
[45] Date of Patent: Aug. 4, 1998

[54] METHOD FOR PLATING A BOND FINGER OF AN INTERGRATED CIRCUIT PACKAGE

[75] Inventors: Koushik Banerjee, Chandler; Robert J. Chroneos, Jr., Tempe; Tom Mozdzen, Gilbert, all of Ariz.

[73] Assignee: Intel Corporation, Santa Clara, Calif.

[21] Appl. No.: 709,587

[22] Filed: Sep. 9, 1996

[51] Int. Cl.$^6$ ..................................................... H05K 3/30
[52] U.S. Cl. ..................... 29/832; 29/830; 29/840; 257/712; 257/713
[58] Field of Search ................ 29/840, 832; 257/707, 257/712, 713

[56] References Cited

U.S. PATENT DOCUMENTS

| | | |
|---|---|---|
| 4,296,456 | 10/1981 | Reid . |
| 4,879,508 | 11/1989 | Ohtsuka et al. . |
| 4,972,253 | 11/1990 | Palino et al. . |
| 5,012,386 | 4/1991 | McShane et al. ................ 257/707 |
| 5,225,709 | 7/1993 | Nishiuma et al. . |
| 5,409,863 | 4/1995 | Newman . |
| 5,468,999 | 11/1995 | Lin et al. . |
| 5,491,362 | 2/1996 | Hamzehdoost ..................... 257/713 X |
| 5,557,502 | 9/1996 | Banerjee et al. . |
| 5,583,378 | 12/1996 | Marrs et al. ........................ 257/712 X |
| 5,621,190 | 4/1997 | Yamasaki et al. . |
| 5,625,225 | 4/1997 | Huang et al. . |
| 5,650,662 | 7/1997 | Edwards et al. ..................... 257/713 X |

*Primary Examiner*—Carl J. Arbes
*Attorney, Agent, or Firm*—Blakely, Sokoloff, Taylor & Zafman

[57] ABSTRACT

A method for plating an integrated circuit package. The method includes constructing a package which has a plurality of internal bond fingers that are subsequently coupled to an integrated circuit. The package contains a plurality of vias that are electrically connected to the bond fingers. The vias are also coupled to a layer of metallization that extends across an outer surface of the package. The meallization layer is used as a plating bar to plate the internal bond fingers. After plating the meallization layer is etched from the surface of the package.

5 Claims, 2 Drawing Sheets

METHOD FOR PLATING A BOND FINGER OF AN INTERGRATED CIRCUIT PACKAGE

BACKGROUND OF THE INVENTION

1. Field of the Invention

The present invention relates to an integrated circuit package.

2. Description of Related Art

Integrated circuits are typically enclosed by a package that is mounted to a printed circuit board. The package has a plurality of external contacts that are solder to the printed circuit board and dedicated to the various power, ground and signal pins of the integrated circuit. The contacts may be solder balls that are attached to external conductive lands of the package. Packages with external solder balls are typically referred to as ball grid array (BGA) packages.

The packages have internal routing layers which couple the external lands to internal bond fingers that are wire bonded to the surface pads of the integrated circuit. The internal routing typically contains separate layers for a ground bus, a power bus and a plurality of signal lines. The various layers are coupled to the external lands by vias that extend through the substrate.

During the manufacturing process of the package, the bond fingers are typically routed to plating tie bars that are used to plate the fingers. The plating tie bars are then decoupled from the fingers in the final assembly. The decoupled plating tie bars can create undesirable capacitance and signal reflection in the package. It would therefore be desirable to provide a method for plating the bond fingers without a plating tie bar that remains in the final package.

SUMMARY OF THE INVENTION

The present invention is a method for plating an integrated circuit package. The method includes constructing a package which has a plurality of internal bond fingers that are subsequently coupled to an integrated circuit. The package contains a plurality of vias that are electrically connected to the bond fingers. The vias are also coupled to a layer of metallization that extends across an outer surface of the package. The metallization layer is used as a plating bar to plate the internal bond fingers. After plating the metallization layer is etched from the surface of the package.

BRIEF DESCRIPTION OF THE DRAWINGS

The objects and advantages of the present invention will become more readily apparent to those ordinarily skilled in the art after reviewing the following detailed description and accompanying drawings, wherein.

DETAILED DESCRIPTION OF THE INVENTION

Figure 1:
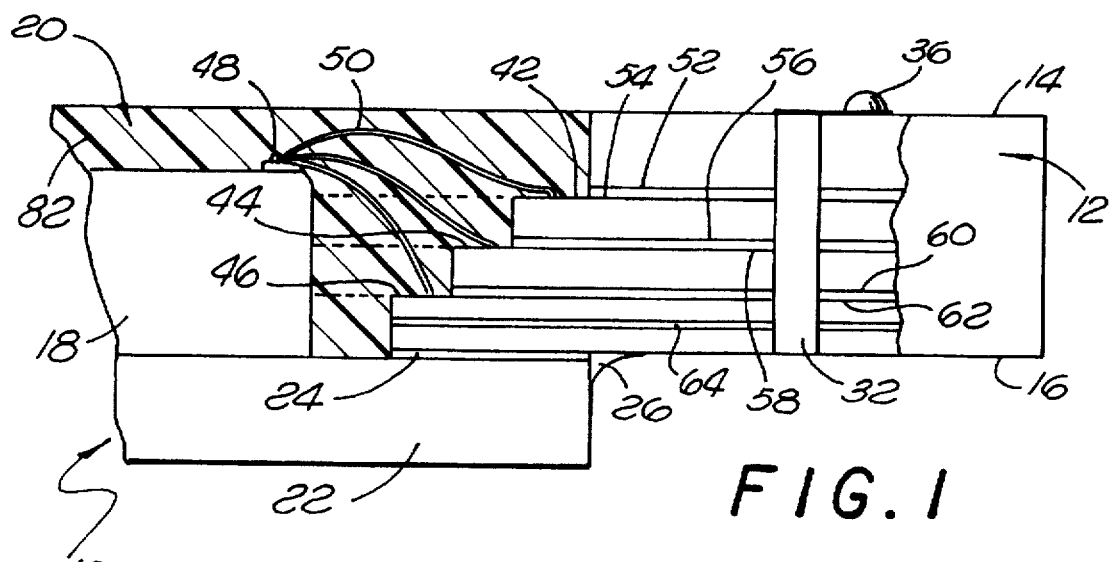
FIG. 1 is a cross-sectional view of an integrated circuit package of the present invention.
Figure 2:
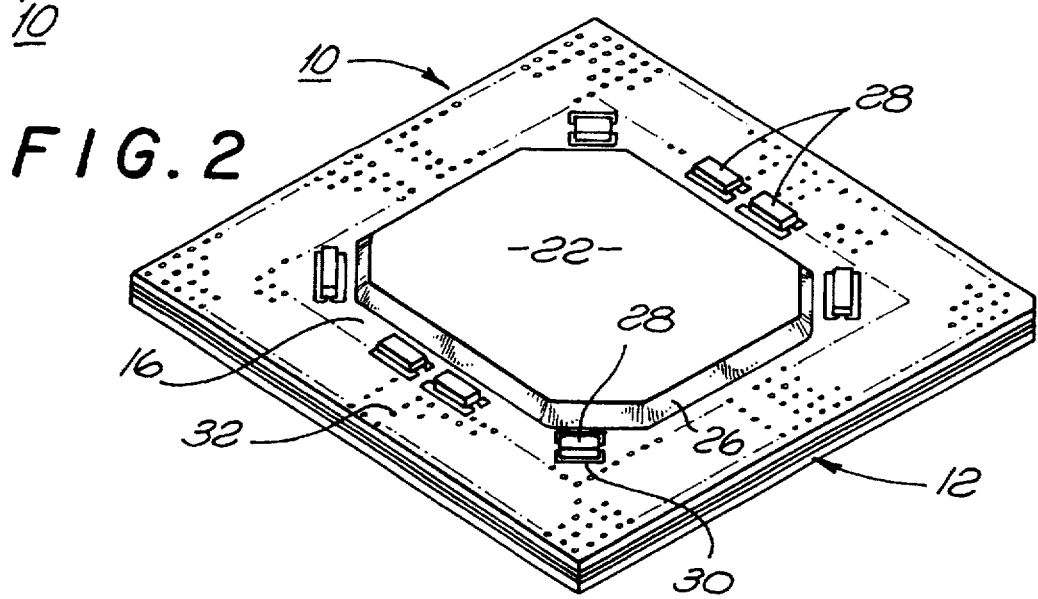
FIG. 2 is a top perspective view of the package.

Referring to the drawings more particularly by reference numbers, FIGS. 1–5 show an integrated circuit package 10 of the present invention. The package 10 includes a substrate 12 that has a first surface 14 and an opposite second surface 16. The substrate 14 is typically constructed as a multilayered printed circuit board, although it is to be understood that the substrate can be constructed with ceramic co-fired processes.

The package 10 includes an integrated circuit 18 located within a die cavity 20 of the substrate 14. The integrated circuit 18 may be a microprocessor or any other electrical device. The integrated circuit 18 is preferably mounted to a heat slug 22 that is attached to the second surface 16 of the substrate 12. The heat slug 22 is typically attached to the substrate 12 with a layer of adhesive 24 and an outer solder fillet 26.

The heat slug 22 is typically constructed from a nickel plated copper material that has a relatively high coefficient of thermal conductivity. The heat slug 22 provides a thermal path of low impedance between the integrated circuit 18 and the ambient of the package. The low thermal impedance of the heat slug 22 reduces the junction temperature of the integrated circuit 18. The heat slug 22 may be electrically connected to the integrated circuit 18 to provide a ground plane for the package 10. Although a heat slug 22 is shown and described, it is to be understood that the integrated circuit 18 may be mounted directly to the substrate 12.

The heat slug 22 preferably has an octagonal shape that has chamfered corners. The chamfered corners increase the amount of usable surface area on the second surface 16. The package 10 may have a plurality of capacitors 28 mounted to land strips 30 located on the second surface 16 of the substrate 12. Although capacitors are shown and described, it is to be understood that any passive or active device can be mounted to the second surface 16.

The package 10 also has a plurality of vias 32 that extend from the second surface 16 to the first surface 14 of the substrate 12. The vias 32 couple the integrated circuit 18 and capacitors 28 to a plurality of lands 34 located on the first surface 14 shown in FIG. 3. The lands 34 are typically connected to an external printed circuit board (not shown) by a plurality of solder balls 36. The solder balls 36 are initially attached to the lands 34 to provide a ball grid array (BGA) package. Although a BGA package is shown and described, it is to be understood that the package may have other external contacts such as pins or solder columns.

Figure 3:
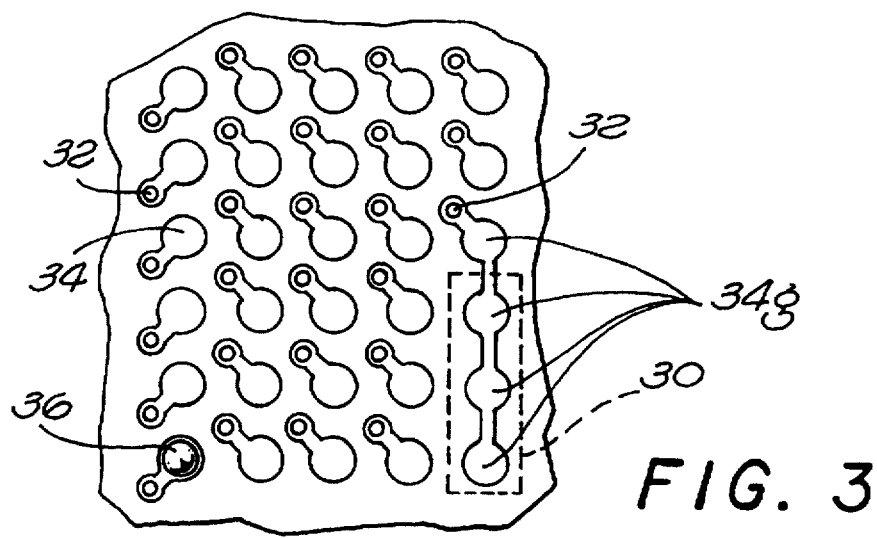
FIG. 3 is a bottom sectional view of the package.

To provide a rugged solder joint it is desirable to construct flat land strips 30 for the capacitors 28. Therefore, in the preferred embodiment there are no vias 32 located within the strips 30. As shown in FIG. 3, most of the lands 34 are coupled to a corresponding dedicated via 32. To eliminate vias and provide additional space on the second surface 16, one or more vias 32 may be connected to a group of lands 34g so that each land 34 does not require a separate dedicated via 32 that interferes with the land strips 30 of the capacitors 28. The land strips 30 of the second surface 16 are located above the lands 34 of the first surface 14 that are connected to the same single via 32. The group of lands 34g are typically connected to a power or ground bus of the package. The present invention provides additional space for mounting capacitors 28 without reducing the number of lands 34 on the package 10.

Figure 5:
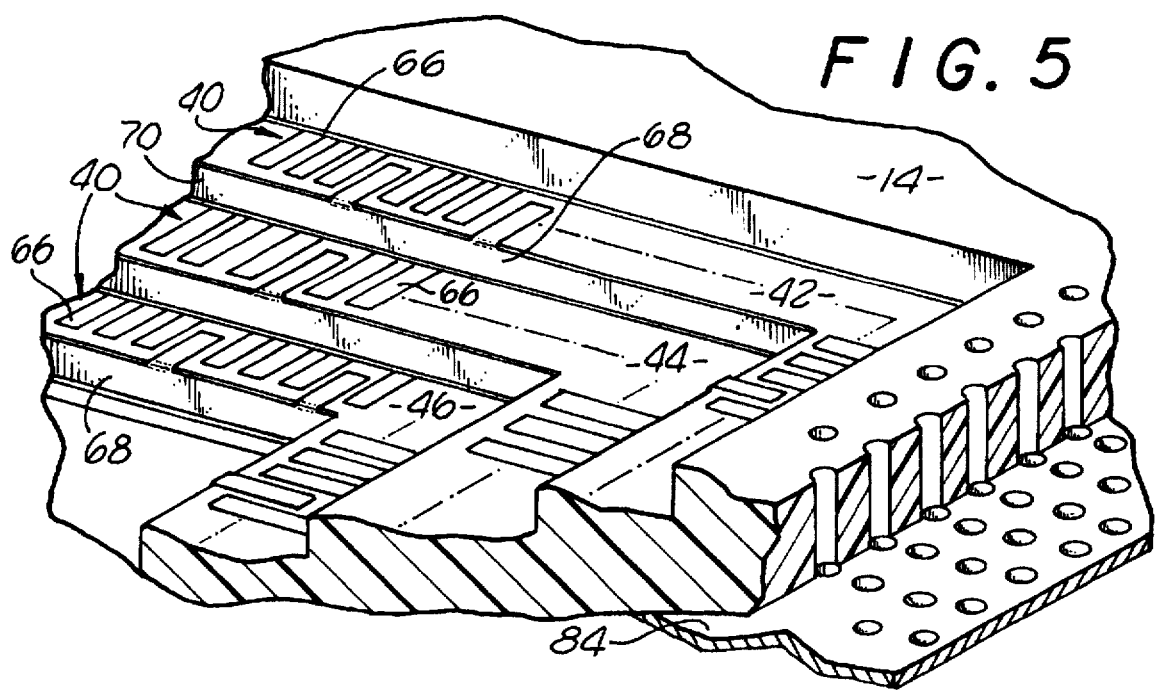
FIG. 5 is a perspective view showing a number of shelves within the package.

As shown in FIGS. 1 and 5, the package 10 has a plurality of bond fingers 40 located on bond shelves 42, 44 and 46 formed in the substrate 12. The bond fingers 40 are coupled to corresponding surface pads 48 of the integrated circuit 18 by bond wires 50. Although bond wires 50 are shown and described, it is to be understood that the integrated circuit 18 may be coupled to the bond fingers 40 by other means such as tape automated bonding (TAB) tape.

The substrate 12 has a plurality of internal routing layers 52, 54, 56, 58, 60, 62 and 64 that are connected to the vias 32. The routing layers and vias couple the bond fingers 40 to the external lands 34 of the package 10. As shown in FIG. 5, some of the bond fingers 40 have traces 66 that extend to the vias 32 or an internal conductive bus of the package. Some of the bond fingers 40 are connected to the conductive busses by conductive strips 68 that wrap around the edges 70 of the shelves. The wrap around strips 68 reduce the number of layers and vias required to construct the package 10. Additionally, the wrap around strips 68 reduce the inductive path to the conductive busses and the overall impedance of the package.

Figure 4:
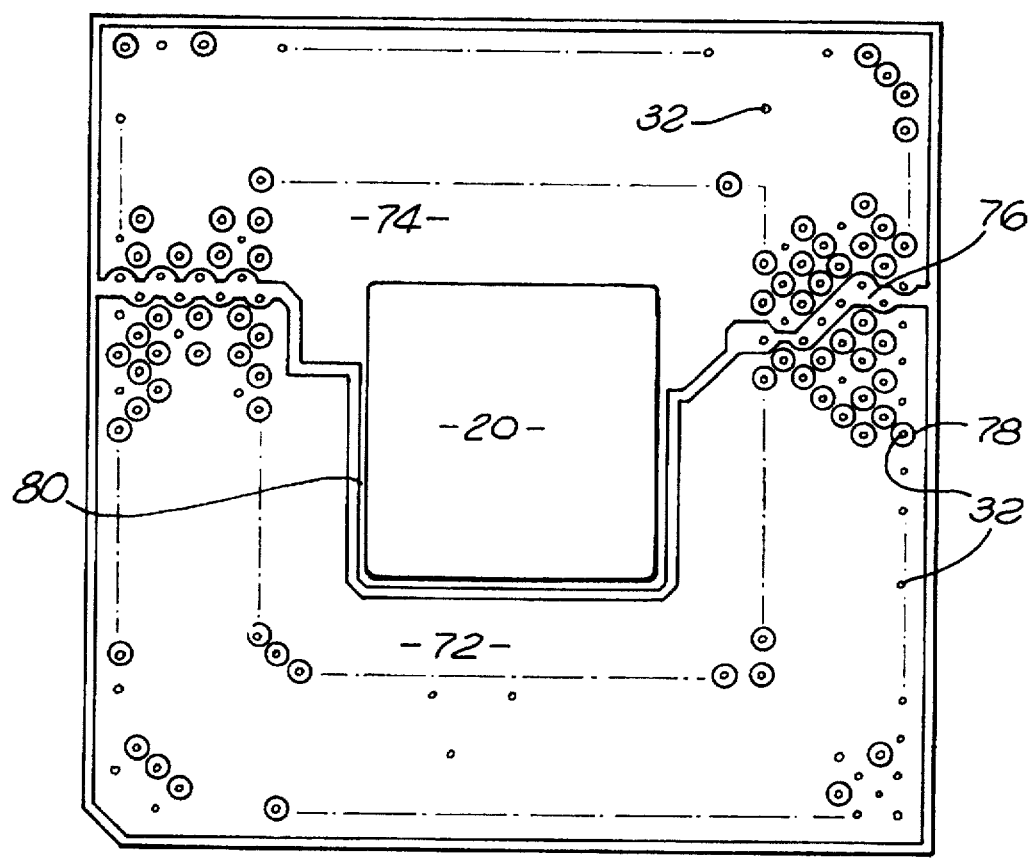
FIG. 4 is a top cross-sectional view showing a pair of power planes of the package.

FIG. 4 shows a layer of the substrate 12 which has a pair of conductive busses 72 and 74. The conductive busses 72 and 74 are separated by a dielectric space 76 to electrically isolate the busses. The busses 72 and 74 are typically dedicated to two different voltage potentials. Some of the vias 32 are connected to the conductive busses 72 and 74 to route the busses to the external lands 34. The remaining vias 32 are dedicated to other signals, power and ground busses within the package 10. The remaining vias 32 have outer rings 78 of dielectric spacing to isolate the vias from the conductive busses 72 and 74. The second bus 74 has a conductive strip 80 that extends around the entire die opening 20 so that the bus 74 can be connected by wrap around strips to any location on the shelves.

The integrated circuit 18 may be a microprocessor which requires power for the processor core and a separate power bus for the input/output (I/O) of the device. Referring to FIG. 1, in the preferred embodiment, the first layer 52 preferably has a first conductive bus dedicated to VSS of the device I/O. The VSS bus is coupled to the bond fingers 40 and external lands 34 by the vias 32. The second layer 54 preferably contains a plurality of signal lines that are coupled to the bond fingers 40 by the traces 66 and to the external lands 34 by vias 32. The third layer 56 preferably includes the split bus pattern shown in FIG. 4. The busses are coupled to the VSS and VCC busses of the device I/O. The VCC bus is coupled to bond fingers 40 on the first shelf 42 by wrap around strips 68.

The fourth layer 58 preferably has a plurality of signal lines that are connected to the bond fingers 40 by traces 66 and to the external lands 34 by vias 32. The fifth layer 60 preferably includes the split bus shown in FIG. 4. The busses are coupled to the VCC and VSS busses of the device I/O. The VSS bus is coupled to the bond fingers 40 of the second shelf 44 by wrap around strips 68. The sixth layer 62 preferably contains a conductive bus that is coupled to bond fingers 66 on the third shelf 46. The conductive bus is dedicated to the VCC bus of the device core. The seventh layer 64 preferably has a conductive bus that is dedicated to the VSS bus of the device core. The VSS bus is coupled to bond fingers 66 on the third shelf 46 by a wrap around strip 68. The second surface 16 of the substrate 12 may have metallization to electrically couple the heat slug 22 to a ground bus of the package. The die cavity 20 is typically filled with a plastic encapsulant 82 to enclose the integrated circuit 18.

The package 10 can be assembled by initially fabricating the substrate 12. The substrate 12 is assembled by etching the bus and signal layers on individual single-sided or double-sided substrates. The conductive strips 68 are then plated onto the edges of the shelves. The strips 68 are typically plated in electrolytic and electrolysis bathes. The individual etched boards are then bonded together to form the substrate 12. The bond fingers 40 are then plated with gold.

The package 10 of the present allows plating without a separate plating bar by utilizing the vias 32 and a layer of metallization 84 located on the second surface 16 as shown in FIG. 5. The metallization layer 84 typically shorts the vias 32 of the substrate 12. A voltage source (not shown) can be connected to the bond fingers 40 and metallization layer to plate the substrate 12. The metallization layer 84 is then etched off of the second surface 16 after the plating process.

After the substrate 12 is fabricated, the heat slug 22 is mounted to the second surface 16. The capacitors 28 may also be soldered to the land strips 30. The integrated circuit 18 is mounted to the heat slug 22 and wire bonded to the bond fingers 40. The die cavity 20 is then filled with the encapsulant 82 to enclose the integrated circuit 18. The solder balls 36 can then be attached to the lands 34.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. A method for plating a bond finger that is located on a substrate of an integrated circuit package which has a via that is coupled to the bond finger, comprising the steps of:

a) creating an electrical connection with the bond finger;

b) creating an electrical connection with the via;

c) providing a voltage across the via and the bond finger; and, d) placing the bond finger within an electrolytic plating bath.

2. The method as recited in claim 1, wherein said via is connected a layer of metallization that extends across an outer surface of the substrate.

3. The method as recited in claim 2, further comprising the step of removing said layer of metallization.

4. The method as recited in claim 1, further comprising the steps of mounting an integrated circuit to the substrate and coupling said integrated circuit to said bond fingers.

5. The method as recited in claim 3, further comprising the steps of mounting an integrated circuit to the substrate and coupling said integrated circuit to said bond fingers.

* * * * *